(12) United States Patent
Nakasu et al.

(10) Patent No.: US 6,213,356 B1
(45) Date of Patent: Apr. 10, 2001

(54) BUMP FORMING APPARATUS AND BUMP FORMING METHOD

(75) Inventors: Yasufumi Nakasu; Masaharu Yoshida; Makoto Kanda; Hiroshi Fukumoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/395,220

(22) Filed: Sep. 14, 1999

(30) Foreign Application Priority Data

Apr. 7, 1999 (JP) .................................................. 11-099789

(51) Int. Cl.⁷ .................................................. B22D 37/00
(52) U.S. Cl. .......................... 222/590; 222/591; 222/593; 228/33
(58) Field of Search ..................................... 222/591, 593, 222/594, 590; 228/33

(56) References Cited

U.S. PATENT DOCUMENTS

| | | | |
|---|---|---|---|
| 5,415,679 | * | 5/1995 | Wallace ................................ 222/590 |
| 5,746,368 | * | 5/1998 | Straub et al. ........................... 228/33 |
| 5,876,615 | * | 3/1999 | Predetechensky .................... 222/590 |
| 6,073,817 | * | 6/2000 | Jairazbhoy ............................ 222/595 |

FOREIGN PATENT DOCUMENTS

WO 97/25175    7/1997  (WO) .

OTHER PUBLICATIONS

J. M. Waldvogel, et al. "Solidification Phenomena in Picoliter Size Solder Droplet Deposition on a Composite Substrate", Int. J. Heat Mass Transfer, vol. 40, No. 2, Dec. 1997, pp. 295–309.

* cited by examiner

Primary Examiner—Scott Kastler
(74) Attorney, Agent, or Firm—Oblon, Spivak, McClelland, Maier & Neustadt, P.C.

(57) ABSTRACT

A bump forming apparatus includes a first tank storing fused solder, a cavity having an inlet for the fused solder, a nozzle arranged on a lower portion of the cavity, a pressure element formed by a diaphragm and a piezoelectric element, and a first heater heating the first tank, a pipe and the cavity. The bump forming apparatus further comprises a static pressure control part having a second tank storing solid solder, a second heater provided around a second opening, a level detector detecting the surface level of the fused solder in the first tank and a level control part controlling driving of the second heater on the basis of a detection signal from the level detector. Thus obtained are a bump forming apparatus and a bump forming method capable of properly avoiding defective discharge, increasing the speed of discharge, avoiding dispersion of an amount of discharge and stabilizing discharge.

20 Claims, 10 Drawing Sheets

BUMP FORMING APPARATUS AND BUMP FORMING METHOD

BACKGROUND OF THE INVENTION

1. Field of the Invention

The present invention relates to a bump forming apparatus and a bump forming method for forming a bump on a land of a substrate or a pad of a chip.

2. Description of the Background Art

Figure 15:
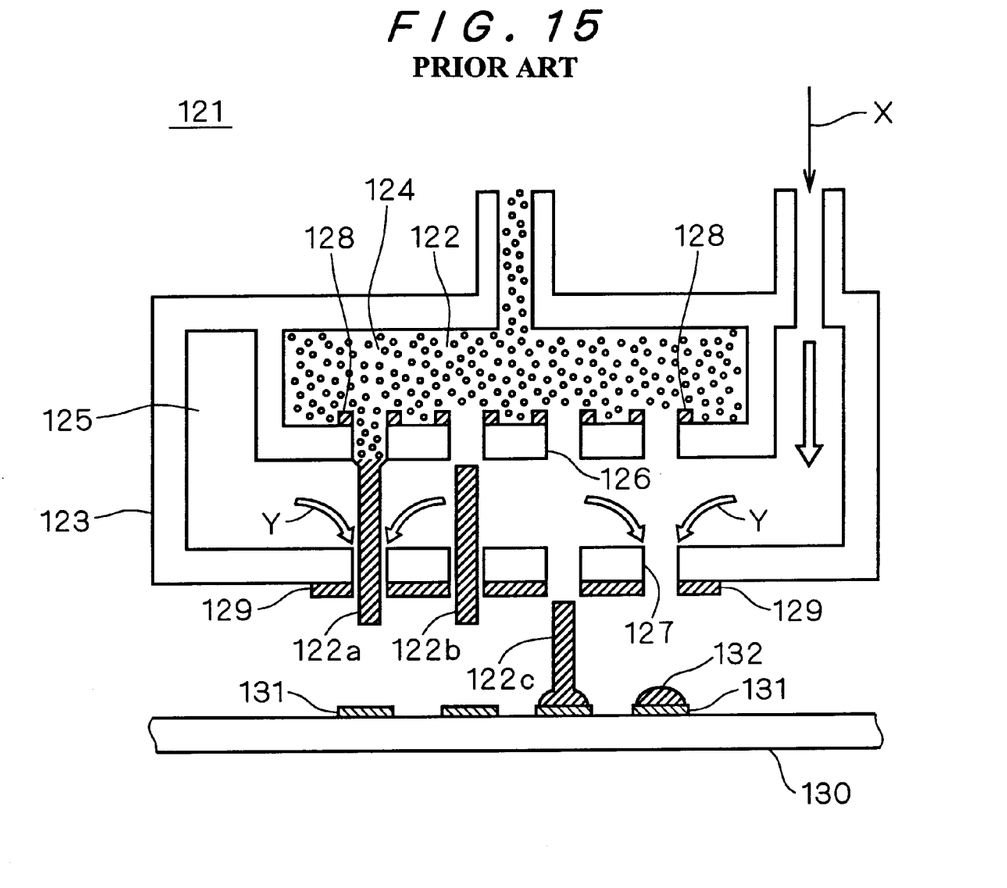
FIG. 15 is a sectional view typically showing the structure of a conventional bump forming apparatus.

FIG. 15 is a sectional view typically showing the structure of a conventional bump forming apparatus (refer to Japanese Patent Laying-Open Gazette No. 3-60036 (1991)). An ink jet printer 121 has a head 123, which is provided therein with a paste chamber 124 and an air chamber 125. The paste chamber 124 is provided with a plurality of inner nozzles 126, while the air chamber 125 is provided with outer nozzles 127 on portions opposite to the inner nozzles 125 respectively. A plurality of control electrodes 128 are provided on a lower surface of the paste chamber 124 around the inner nozzles 126. A plurality of common electrodes 129 are provided on a lower surface of the air chamber 125 around the outer nozzles 127.

A method of forming bumps with the ink jet printer 121 shown in FIG. 15 is now described. First, a semiconductor element 130 is arranged oppositely to the head 123. More specifically, the semiconductor element 130, which is provided with a plurality of electrode pads 131, is so located that the plurality of electrode pads 131 are opposed to the plurality of outer nozzles 127 respectively.

Then, compressed air is externally supplied into the air chamber 125 as shown by arrow X. The pressure of the compressed air is set to about 0.5 kg/cm² to several kg/cm², for example. At this time, the paste chamber 124 holds conductor paste 122 therein. The conductor paste 122 consists of metal powder, a binder and an adhesive. The metal powder, which is chosen in consideration of the materials for bumps 132 to be formed and the electrode pads 131 or the like, is prepared from powder of solder, tin or lead. The binder, which is employed as a solvent, is prepared from volatile methyl alcohol, isopropyl alcohol or methyl ethyl ketone. The adhesive is prepared that having a flux action. The compressed air supplied into the air chamber 125 forms air flows Y to flow out through the outer nozzles 127.

Then, voltage of about minus several 100 V is applied between the control electrodes 128 and the common electrodes 129. Due to electrostatic force resulting from this voltage application, the conductor paste 122 is extracted in a constant amount from the paste chamber 124 successively through the inner nozzles 126, the air chamber 125 and the outer nozzles 127. At this time, the air flows Y guide the conductor paste 122 to the outer nozzles 127 and quickly push out the conductor paste 122.

The conductor paste 122 discharged from the outer nozzles 127 splashes in the form of thin threads of about 10 μm to several 10 μm in diameter, for example, to adhere onto the electrode pads 131 of the semiconductor element 130. FIG. 15 sequentially illustrates conductive paste 122a starting to be discharged, discharged conductor paste 122b and conductor paste 122c starting to adhere onto one of the electrode pads 131. Finally a bump 132 is formed on each electrode pad 131.

However, the conventional bump forming apparatus, employing the ink jet printer 121 while simply using the conductor paste 122 in place of ink, has the following problems:

First, the inner and outer nozzles 126 and 127, which are readily clogged with the conductor paste 122 containing the metal powder of solder or the like and the adhesive, tend to defectively discharge the conductor paste 122.

Further, the conductor paste 122 has high viscosity due to the adhesive contained therein, while the air chamber 125 applies pressure of about 0.5 kg/cm² to everal kg/cm² to the inner nozzles 126. Therefore, it takes a long time after the conductor paste 122 is temporarily discharged from the inner nozzles 126 until new conductor paste 122 fills up the inner nozzles 126. Thus, it is difficult to discharge the conductor paste 122 at a high speed, while the amount of discharge is dispersed if the conductor paste 122 is discharged in a state incompletely filling up the inner nozzles 126.

Further, since pressure is applied to the inner nozzles 126 from the air chamber 125, air enters the paste chamber 124 from the air chamber 125 through the inner nozzles 126 when the conductor paste 122 is discharged from the inner nozzles 126 to form bubbles, which cause unstable discharge of the conductor paste 122.

SUMMARY OF THE INVENTION

A bump forming apparatus according to a first aspect of the present invention comprises a first tank storing fused solder and having an outlet for the fused solder, a pipe having one end connected with the outlet, a cavity, arranged below the first tank, having an inlet for the fused solder connected with another end of the pipe, a nozzle, arranged on a lower portion of the cavity, having a first opening on its bottom surface, a pressure element properly pressurizing the fused solder in the cavity toward the first opening in order to drop the fused solder from the first opening, a first heater heating the first tank and the cavity, and a static pressure control part for keeping static pressure of the fused solder applied to the nozzle at a constant value.

According to the first aspect of the present invention, the static pressure of the fused solder applied to the nozzle is kept at a constant value, whereby discharge of the fused solder from the first opening can be stabilized.

According to a second aspect of the present invention, the pressure element of the bump forming apparatus according to the first aspect has a diaphragm arranged on an upper portion of the cavity and a piezoelectric element fixed to an upper surface of the diaphragm, and the diaphragm is capable of pressurizing the fused solder in the cavity toward the first opening and oppositely to the first opening.

According to the second aspect of the present invention, the fused solder discharged from the first opening breaks away well, whereby the amount of the fused solder discharged from the first opening can be stably ensured even if the fused solder has high viscosity.

According to a third aspect of the present invention, the static pressure control part of the bump forming apparatus according to the first aspect has a second tank, arranged above the first tank, storing solid solder and having a second opening on its bottom surface, a second heater provided around the second opening, a level detector detecting the surface level of the fused solder in the first tank and a control part controlling driving of the second heater on the basis of a detection signal from the level detector.

According to the third aspect of the present invention, the surface level of the fused solder in the first tank is kept constant, whereby the static pressure applied to the nozzle can be kept at a constant value.

According to a fourth aspect of the present invention, the bump forming apparatus according to the third aspect further comprises an inert gas introduction part introducing inert gas into the second tank and an inert gas discharge part discharging the inert gas from the second tank.

According to the fourth aspect of the present invention, the solid solder can be prevented from oxidation in the second tank.

According to a fifth aspect of the present invention, the bump forming apparatus according to the third aspect further comprises an inert gas introduction part introducing inert gas into the first tank and an inert gas discharge part discharging the inert gas from the first tank.

According to the fifth aspect of the present invention, the fused solder can be prevented from oxidation in the first tank.

According to a sixth aspect of the present invention, the static pressure control part of the bump forming apparatus according to the first aspect has an inert gas introduction part introducing inert gas into the first tank, a first gas flow rate control part controlling the amount of the inert gas flowing into the first tank from the inert gas introduction part, a gas discharge part discharging the gas from the first tank, a second gas flow rate control part controlling the amount of the gas flowing out from the first tank through the gas discharge part, a level detector detecting the surface level of the fused solder in the first tank, and a gas pressure control part controlling driving of at least one of the first and second gas flow rate control parts on the basis of a detection signal from the level detector.

According to the sixth aspect of the present invention, the pressure of the inert gas in the first tank is sequentially increased in response to reduction of the surface level of the fused solder in the first tank, whereby the static pressure of the fused solder applied to the nozzle can be kept at a constant value.

According to a seventh aspect of the present invention, the bump forming apparatus according to the sixth aspect further comprises a solder shortage display part displaying solder shortage when the surface level of the fused solder in the first tank falls below a previously set level.

According to the seventh aspect of the present invention, the operator can recognize solder shortage in early stages.

According to an eighth aspect of the present invention, the bump forming apparatus according to the sixth aspect further comprises a detachable nozzle lid blocking the first opening and a driving part driving the nozzle lid.

According to the eighth aspect of the present invention, a bubble mixed into the fused solder can be removed by carrying out steps of introducing solid solder into the first tank, blocking the first opening with the nozzle lid, closing the first gas flow rate control part and opening the second gas flow rate control part thereby evacuating the first tank and the cavity, heating/fusing the solid solder with the first heater and removing the nozzle lid and opening the first gas flow rate control part after the bubble mixed into the fused solder is removed. Thus, the amount of the fused solder discharged from the first opening and the discharge position can be stabilized.

According to a ninth aspect of the present invention, the bump forming apparatus according to any of the first to eighth aspects further comprises a filter provided in the pipe for removing an impurity contained in the fused solder.

According to the ninth aspect of the present invention, the impurity contained in the fused solder can be removed through the filter, thereby preventing the nozzle from clogging resulting from oxidation of the impurity.

According to a tenth aspect of the present invention, the bump forming apparatus according to any of the first to eighth aspects further comprises a cover, provided around the first opening, having an open bottom surface, and an inert gas inlet introducing inert gas into the cover.

According to the tenth aspect of the present invention, the fused solder stored in the nozzle can be prevented from oxidation through the first opening.

According to an eleventh aspect of the present invention, the bump forming apparatus according to any of the first to eighth aspects further comprises a sensor detecting presence/absence of dropping of the fused solder from the first opening.

According to the eleventh aspect of the present invention, operations of the apparatus are stopped when the fused solder is defectively discharged, whereby preparation of a defective chip can be prevented.

According to a twelfth aspect of the present invention, the bump forming apparatus according to any of the first to eighth aspects further comprises a cover, having open upper and bottom surfaces, arranged in a dropping path for the fused solder between the first opening and an object for forming a bump around a portion for forming the bump, a reducing gas inlet introducing reducing gas into the cover, and a heating tool locally heating the bump.

According to the twelfth aspect of the present invention, surface oxidation of the bump can be reduced, whereby adhesion between the object of bump formation and the bump can be improved. Further, the heating tool does not wholly heat the object of bump formation but locally heats only the bump, whereby occurrence of inconvenience on the object of bump formation can be suppressed as compared with the case of wholly heating the object of bump formation.

According to a thirteenth aspect of the present invention, the bump forming apparatus according to any of the first to eighth aspects further comprises a detachable nozzle cap blocking the first opening, an inert gas introduction pipe introducing inert gas into the nozzle cap, and a driving part driving the nozzle cap.

According to the thirteenth aspect of the present invention, the first opening is blocked with the nozzle cap and the inert gas is introduced into the nozzle cap during stoppage of the apparatus, whereby the fused solder in the nozzle can be prevented from oxidation through the first opening.

According to a fourteenth aspect of the present invention, the first heater of the bump forming apparatus according to any of the first to eighth aspects individually has a third heater heating the first tank and a fourth heater heating the cavity.

According to the fourteenth aspect of the present invention, the viscosity of the fused solder around the nozzle can be reduced by heating the cavity to a temperature higher than the solder fusing temperature with the fourth heater, so that a stable amount of the fused solder discharged from the first opening can be ensured even if the fused solder has a high viscosity. In addition, the first tank is heated to a temperature around the solder fusing temperature with the third heater, not to prompt oxidation of the fused solder in the first tank.

According to a fifteenth aspect of the present invention, the bump forming apparatus according to any of the first to eighth aspects further comprises a suction tool attachable/detachable to/from the first opening for sucking the fused solder from the first opening, and a driving part driving the suction tool.

According to the fifteenth aspect of the present invention, part of the fused solder mixed with a bubble or oxidized through the first opening can be sucked/removed by the suction tool. Thus, discharge of the fused solder from the first opening can be stabilized.

According to a sixteenth aspect of the present invention, the bump forming apparatus according to any of the first to eighth aspects further comprises a solder residue removing tool for sweeping off/removing solder residue adhering onto the bottom surface of the nozzle around the first opening and a driving part driving the solder residue removing tool.

According to the sixteenth aspect of the present invention, solder residue adhering onto the bottom surface of the nozzle is swept off/removed by the solder residue removing tool, whereby the discharge position for the fused solder can be stabilized.

According to a seventeenth aspect of the present invention, the bottom surface of the nozzle around the first opening is coated with a material repelling solder in the bump forming apparatus according to any of the first to eighth aspects.

According to the seventeenth aspect of the present invention, solder residue hardly adheres onto the bottom surface of the nozzle, whereby the discharge position for the fused solder can be stabilized.

According to an eighteenth aspect of the present invention, at least inner surfaces of the first tank and the cavity are coated with a material having good solder wettability in the bump forming apparatus according to any of the first to eighth aspects.

According to the eighteenth aspect of the present invention, a bubble is hardly formed in the fused solder, whereby discharge can be stabilized.

According to a nineteenth aspect of the present invention, the bump forming apparatus according to any of the first to eighth aspects further comprises a lattice structure provided in the first tank.

According to the nineteenth aspect of the present invention, swinging of the fused solder in the first tank can be suppressed by the lattice structure provided in the first tank. Thus, the static pressure of the fused solder applied to the nozzle can be stabilized, thereby stabilizing discharge.

A bump forming apparatus according to a twentieth aspect of the present invention comprises a cavity storing fused solder, a nozzle, arranged on a lower portion of the cavity, having a first opening on its bottom surface, and a pressure element properly pressurizing the fused solder in the cavity toward the first opening for dropping the fused solder from the first opening, while the pressure element has a diaphragm arranged on an upper portion of the cavity and a piezoelectric element fixed to an upper surface of the diaphragm, and the diaphragm is capable of pressurizing the fused solder in the cavity toward the first opening and oppositely to the first opening.

According to the twentieth aspect of the present invention, the fused solder discharged from the first opening breaks away well, whereby the amount of the fused solder discharged from the first opening can be stably ensured even if the fused solder has high viscosity.

A semiconductor manufacturing apparatus according to a twenty-first aspect of the present invention comprises the bump forming apparatus according to any of the first to twentieth aspects.

According to the twenty-first aspect of the present invention, a semiconductor device having no defective bumps can be manufactured.

A bump forming method according to a twenty-second aspect of the present invention comprises steps of (a) introducing solid solder into a container, (b) evacuating the container, (c) heating the container thereby fusing the solid solder and obtaining fused solder, (d) releasing the container from the vacuum state after a bubble mixed into the fused solder is removed and (e) discharging the fused solder toward an object of bump formation.

According to the twenty-second aspect of the present invention, a bubble mixed into the fused solder can be removed when heating/fusing solid solder, whereby the amount of discharge of the fused solder and the discharge position can be prevented from dispersion resulting from such a bubble.

A bump forming method according to a twenty-third aspect of the present invention is a method of pressurizing fused solder stored in a cavity with a pressure element arranged on an upper portion of the cavity thereby discharging the fused solder onto an object of bump formation from a nozzle arranged on a lower portion of the cavity, and comprises steps of (a) pressurizing the fused solder in the cavity toward the nozzle with the pressure element and (b) pressurizing the fused solder in the cavity oppositely to the nozzle with the pressure element.

According to the twenty-third aspect of the present invention, the fused solder discharged from the first opening breaks away well, whereby the amount of discharge of the fused solder can be stably ensured even if the fused solder has high viscosity.

A bump forming method according to a twenty-fourth aspect of the present invention is a method of forming a bump on an object of bump formation by discharging stored fused solder from a nozzle, and comprises steps of (a) dummy-discharging the fused solder from the nozzle and (b) discharging the fused solder toward the object of bump formation after the step (a).

According to the twenty-fourth aspect of the present invention, the fused solder is discharged toward the object of bump formation after dummy discharge, whereby discharge toward the object of bump formation can be stabilized even if the stored fused solder is oxidized through the nozzle due to stoppage of the apparatus over a long time or the like.

An object of the present invention is to obtain a bump forming apparatus and a bump forming method which can properly avoid defective discharge, increase the speed of discharge, avoid dispersion of the amount of discharge and stabilize discharge.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1.

Figure 1:
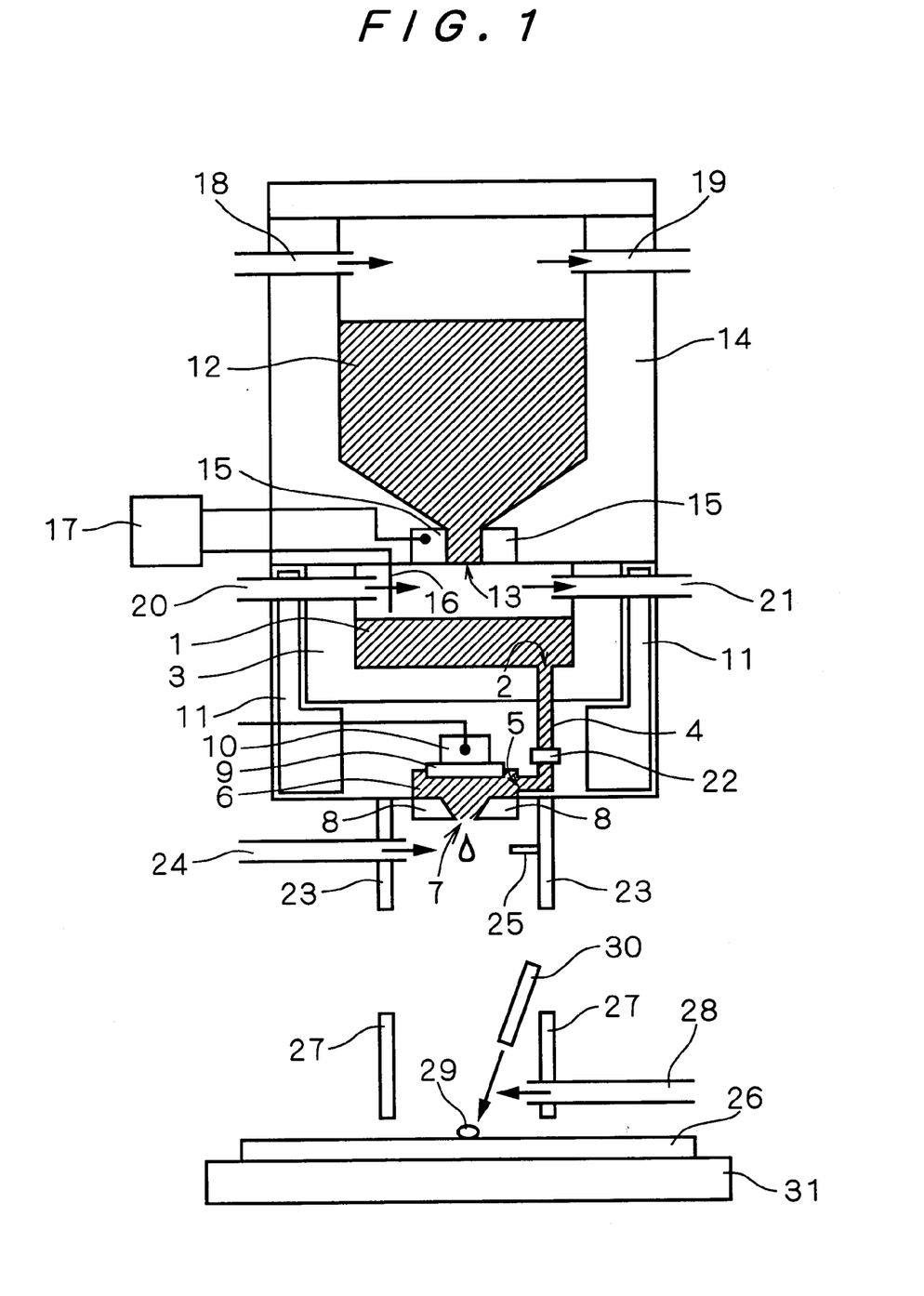
FIG. 1 is a sectional view typically showing the structure of a bump forming apparatus according to an embodiment 1 of the present invention.

FIG. 1 is a sectional view typically showing the structure of a bump forming apparatus according to an embodiment 1 of the present invention. The bump forming apparatus shown in FIG. 1 comprises a first tank 3 storing fused solder 1 prepared by fusing solder serving as a bump material and having an outlet 2 for the fused solder 1 on its bottom surface, a pipe 4 having one end connected with the outlet 2, a cavity 6, arranged below the first tank 3, having an inlet 5 for the fused solder 1 connected with another end of the pipe 4, a nozzle 8, arranged on a lower portion of the cavity 6, having a first opening 7 on its bottom surface, a pressure element formed by a diaphragm 9 arranged on an upper portion of the cavity 6 and a piezoelectric element 10 fixed to an upper surface of the diaphragm 9 for properly pressurizing the fused solder 1 in the cavity 6 toward the first opening 7 by external voltage application thereby dropping the fused solder 1 from the first opening 7, and a first heater 11 heating the first tank 3, the pipe 4 and the cavity 6.

The bump forming apparatus shown in FIG. 1 further comprises a static pressure control part having a second tank 14, arranged above the first tank 3, storing solid solder 12 and having a second opening 13 on its bottom surface, a second heater 15 provided around the second opening 13 for heating/fusing the solder 12 around the second opening 13 and dropping the same into the first tank 3 as fused solder, a level detector 16 detecting the surface level of the fused solder 1 in the first tank 3, and a level control part 17 controlling driving (temperature rise/drop) of the second heater 15 on the basis of a detection signal from the level detector 16.

The bump forming apparatus shown in FIG. 1 further comprises an inert gas introduction pipe 18 for introducing inert gas such as nitrogen into the second tank 14 and an inert gas discharge pipe 19 for discharging the inert gas from the second tank 14.

The bump forming apparatus shown in FIG. 1 further comprises an inert gas introduction pipe 20 for introducing inert gas into the first tank 3 and an inert gas discharge pipe 21 for discharging the inert gas from the first tank 3.

The bump forming apparatus shown in FIG. 1 further comprises a mesh filter 22 of ceramic or SuS provided in the pipe 4 for removing an impurity such as Fe contained in the fused solder 1.

The bump forming apparatus shown in FIG. 1 further comprises an atmosphere cover 23, provided around the first opening 7, having an open bottom surface and an inert gas introduction pipe 24 for introducing for introducing inert gas into the atmosphere cover 23.

The bump forming apparatus shown in FIG. 1 further comprises a sensor 25 detecting presence/absence of dropping of the fused solder 1 from the first opening 7. The fused solder 1 is discharged from the first opening 7 at a high speed of 1 m/s to 5 m/s, and hence a hold circuit (not shown) holding an output signal from the sensor 25 for a constant time is preferably provided for detecting presence/absence of dropping of the fused solder 1 from the first opening 7 through a hold signal output from the hold circuit.

The bump forming apparatus shown in FIG. 1 further comprises a reducing atmosphere cover 27, having open upper and bottom surfaces, arranged in a dropping path for the fused solder 1 between the first opening 7 and a chip 26 to be formed with a bump 29 around a portion for forming the bump 29, a reducing gas introduction pipe 28 for introducing reducing gas into the reducing atmosphere cover 27 and a heating torch 30 heating the bump 29. The chip 26 is placed on a heat stage 31 for heating the chip 26 to a constant temperature below the solder fusing point.

A bump forming method employing the bump forming apparatus shown in FIG. 1 is now described. First, the solid solder 12 is introduced into the second tank 14. Then, the solder 12 around the second opening 13 is heated/fused with the second heater 15, and dropped into the first tank 3 as the fused solder 1. The fused solder 1 is dropped from the second tank 14 until the surface level of the fused solder 1 stored in the first tank 3 reaches a prescribed position. More specifically, the fused solder 1 is dropped until the level detector 16 detects contact with the fused solder 1.

The fused solder 1 stored in the first tank 3 flows into the cavity 6 from the outlet 2 through the pipe 4, the filter 22 and the inlet 5 by its own weight, and fills up the cavity 6. At this time, the first heater 11 increases the temperatures of the first tank 3, the pipe 4 and the cavity 6 respectively. Further, inert gas is previously introduced from the inert gas introduction pipe 20 into the first tank 3 and discharged from the inert gas discharge pipe 21 while inert gas is introduced into the second tank 14 from the inert gas introduction pipe 18 and discharged from the inert gas discharge pipe 19. Further, inert gas is introduced into the atmosphere cover 23 from the inert gas introduction pipe 24.

Then, voltage is externally applied to the piezoelectric element 10 for expanding the piezoelectric element 10 thereby displacing the diaphragm 9 toward the first opening 7 and dropping the fused solder 1 from the first opening 7 by the pressure. When the fused solder 1 is dropped from the first opening 7, the surface level of the fused solder 1 in the first tank 3 so lowers that the fused solder 1 loses contact with the level detector 16. Then, the level control part 17 detects this and drives the second heater 15 for supplementing the fused solder 1 in the first tank 3. Thus, the surface level of the fused solder 1 in the first tank 3 is kept at a constant level.

The fused solder 1 dropped from the first opening 7 passes through the atmosphere cover 23 and the reducing atmosphere cover 27 in this order, to reach a prescribed bump forming portion (e.g., an electrode) on the chip 26 and form the bump 29, which is fixed onto the chip 26.

The fixed bump 29 is locally heated with the heating torch 30 in the reducing atmosphere cover 27. The local heating with the heating torch 30 can be performed by irradiating the bump 29 with a laser beam or through electric discharge. At this time, reducing gas (e.g., 5% of $H_2$ and 95% of $N_2$) is introduced into the reducing atmosphere cover 27 from the reducing gas introduction pipe 28. Thus, surface oxidation of the bump 29 is reduced.

Figure 2:
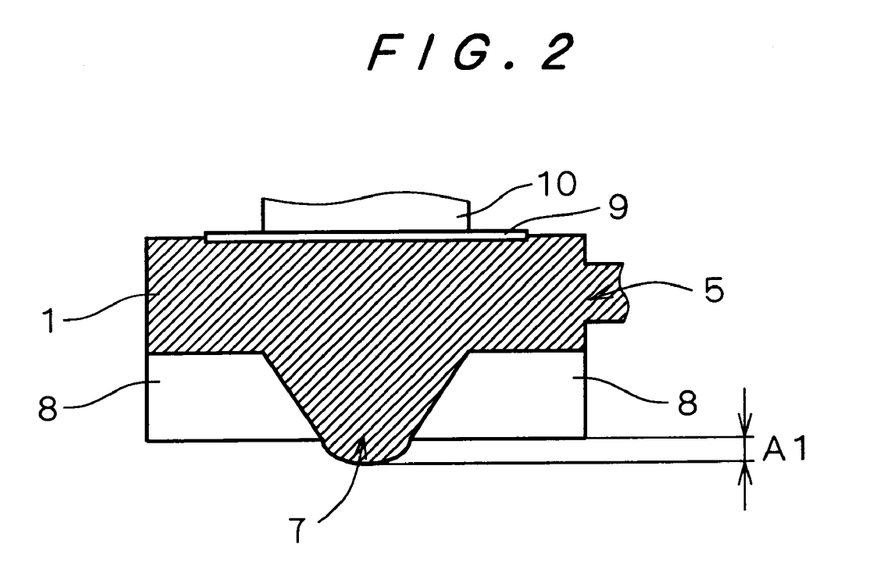
FIG. 2 is a sectional view showing a state of fused solder around a first opening.

FIG. 2 is a sectional view showing the state of the fused solder 1 around the first opening 7. Static pressure of the fused solder 1 applied to the nozzle 8 is in proportion to the distance between the nozzle 8 and the level of the fused solder 1 in the first tank 3. According to the bump forming apparatus and the bump forming method of the embodiment 1, as hereinabove described, the surface level of the fused solder 1 in the first tank 3 can be kept at a constant level, whereby the static pressure of the fused solder 1 applied to the nozzle 8 can be kept at a constant value. Even if the solder material has high viscosity, therefore, the drop size A1 of the fused solder 1 from the nozzle 8 can be set to a constant value in a short and constant time as shown in FIG. 2. Thus, discharge of the fused solder 1 from the first opening 7 can be stabilized.

The inert gas is introduced into the second tank 14 from the inert gas introduction pipe 18, whereby the solid solder 12 can be prevented from oxidation in the second tank 14.

The inert gas is introduced into the first tank 3 from the inert gas introduction pipe 20, whereby the fused solder 1 can be prevented from oxidation in the first tank 3.

The impurity contained in the fused solder 1 can be removed through the filter 22, whereby the nozzle 8 can be prevented from being clogged by oxidation of the impurity.

The atmosphere cover 23 is provided around the first opening 7 so that the inert gas is introduced into the atmosphere cover 23 from the inert gas introduction pipe 24, whereby the fused solder 1 stored in the cavity 6 and the nozzle 8 can be prevented from oxidation through the first opening 7.

The discharge sensor 25 detects presence/absence of dropping of the fused solder 1 from the first opening 7, whereby preparation of a defective chip can be prevented by stopping operations of the apparatus when the fused solder 1 is defectively discharged.

Surface oxidation of the bump 29 fixed onto the chip 26 can be reduced with the reducing atmosphere cover 27 and the heating torch 30, whereby adhesion between the chip 26 and the bump 29 can be improved. In order to generally reduce a solder bump, the solder bump must be heated to at least 300° C. If a chip or a substrate to be formed with the bump has a low heat-resisting temperature, therefore, inconvenience may be caused on the chip or the like when the chip or the like is wholly heated. According to the bump forming apparatus and the bump forming method of the embodiment 1, however, the chip 26 is not wholly heated but only the bump 29 is locally heated with the heating torch 30, whereby occurrence of inconvenience on the chip 26 can be suppressed as compared with the case of wholly heating the chip 26.

The conventional bump forming apparatus employs flux for the paste, and hence a step of and an apparatus for washing out the flux are required after forming a bump. According to the bump forming apparatus and the bump forming method of the embodiment 1, on the other hand, no flux is employed to require no step of and apparatus for washing out flux, whereby treating steps and a treating apparatus can be simplified.

Embodiment 2.

Figure 3:
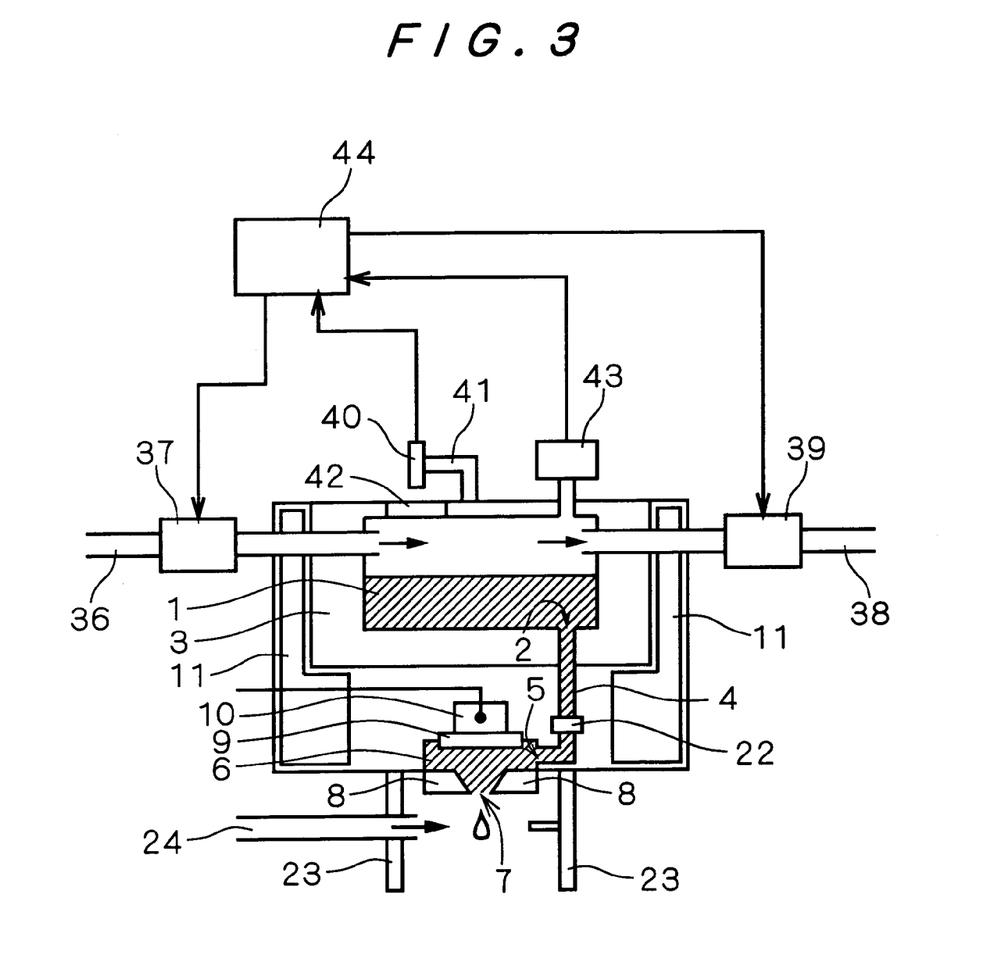
FIG. 3 is a sectional view typically showing the structure of a bump forming apparatus according to an embodiment 2 of the present invention.

FIG. 3 is a sectional view typically showing the structure of a bump forming apparatus according to an embodiment 2 of the present invention. Elements corresponding to the chip 26, the reducing atmosphere cover 27, the reducing gas introduction pipe 28 and the heat stage 31 shown in FIG. 1 are not shown in FIG. 3. The bump forming apparatus according to the embodiment 2 is based on the bump forming apparatus according to the embodiment 1 shown in FIG. 1, and provided with another static pressure control part in place of the static pressure control part according to the embodiment 1 having the second tank 14, the second heater 15, the level detector 16 and the level control part 17.

As shown in FIG. 3, the static pressure control part according to the embodiment 2 has an inert gas introduction pipe 36 for introducing inert gas into a first tank 3, a first valve 37 for controlling the amount of the inert gas flowing into the first tank 3 from the inert gas introduction pipe 36, an inert gas discharge pipe 38 for discharging the inert gas from the first tank 3, a second valve 39 for controlling the amount of the inert gas flowing out from the first tank 3 through the inert gas discharge pipe 38, a surface level sensor 40 detecting the surface level of fused solder 1 in the first tank 3, a gas pressure sensor 43 detecting the pressure of the inert gas in the first tank 3, and a gas pressure control part 44 controlling driving of at least one of the first valve 37 and the second valve 39 on the basis of detection signals from the surface level sensor 40 and the gas pressure sensor 43.

The surface level sensor 40 is fixed to an upper surface of the first tank 3 by a sensor mounting plate 41. The surface level sensor 40 can be formed by a well-known photosensor, and a glass window 42 for passing light emitted by the surface level sensor 40 is provided on the upper surface of the first tank 3 under the surface level sensor 40.

A bump forming method employing the bump forming apparatus shown in FIG. 3 is now described. First, solid solder is introduced into the first tank 3, and thereafter a first heater 11 heats and fuses the solid solder, thereby storing fused solder 1 in the first tank 3. The fused solder 1 stored in the first tank 3 fills up a cavity 6, similarly to that in the embodiment 1. The surface level sensor 40 detects a current surface level h1 of the fused solder 1 in the first tank 3 and inputs the same in the gas pressure control part 44. The gas pressure control part 44 stores the surface level h1 input from the surface level sensor 40.

Then, inert gas is introduced into the first tank 3 from the inert gas introduction pipe 36. At this time, the first valve 37 controls the inert gas flowing into the first tank 3 from the inert gas introduction pipe 36 to a constant amount. The inert gas introduced into the first tank 3 is discharged through the inert gas discharge pipe 38. The gas pressure sensor 43 detects current gas pressure Pb1 in the first tank 3, and inputs the same in the gas pressure control part 44. The gas pressure control part 44 stores the gas pressure Pb1 input from the gas pressure sensor 43.

Then, a diaphragm 9 is displaced by a piezoelectric element 10 similarly to the embodiment 1, thereby dropping the fused solder 1 from a first opening 7. When the fused solder 1 is dropped from the first opening 7, the surface level of the fused solder 1 in the first tank 3 lowers as described above.

Relation $P=h\times\rho\times G+Pb$ holds between static pressure P of the fused solder 1 applied to a nozzle 8 and the gas pressure Pb of the inert gas in the first tank 3, where h represents the height of the level of the fused solder 1 in the first tank 3 from the nozzle 8, p represents the density of the fused solder 1, and G represents the gravity. In the above equation, p and G are known and hence P can be kept at a constant value by adjusting Pb when L changes.

The surface level of the fused solder 1 in the first tank 3 lowers as a result of dropping from the first opening 7 as described above, while the surface level sensor 40 sequentially detects this surface level h2 of the fused solder 1 in the first tank 3 and inputs the same in the gas pressure control part 44. The gas pressure control part 44 calculates change Δh of the surface level of the fused solder 1 on the basis of the input surface level h2 and the previously stored surface level h1. The gas pressure control part 44 further calculates gas pressure Pb2 of the inert gas for keeping the static pressure P of the fused solder 1 applied to the nozzle 8 at a constant value with reference to the change Δh of the surface level, thereby calculating difference ΔPb between the gas pressure Pb2 and the previously stored gas pressure Pb1. The gas pressure control part 44 adjusts the second valve 39 to compensate for the difference ΔPb, i.e., so that the pressure of the inert gas in the first tank 3 reaches Pb2.

In the above description, the amount of the inert gas introduced into the first tank 3 from the inert gas introduction pipe 36 is set constant while the amount of the inert gas discharged from the first tank 3 through the inert gas discharge tank 38 is sequentially reduced in response to lowering of the surface level of the fused solder 1. Alternatively, the amount of the inert gas discharged from the first tank 3 may be set constant while the amount of the inert gas introduced into the first tank 3 may be sequentially increased in response to lowering of the surface level of the fused solder 1.

If the amount of the fused solder 1 stored in the first tank 3 is small from the first, change of the static pressure of the fused solder 1 resulting from lowering of the surface level is also small and hence the static pressure of the fused solder 1 may not be controlled in the aforementioned manner.

According to the bump forming apparatus and the bump forming method of the embodiment 2, as hereinabove described, the pressure of the inert gas in the first tank 3 is sequentially increased in response to lowering of the surface level of the fused solder 1 in the first tank 3, whereby the static pressure of the fused solder 1 applied to the nozzle 8 can be kept at a constant value. Thus, discharge of the fused solder 1 from the first opening 7 can be stabilized similarly to the bump forming apparatus and the bump forming method according to the embodiment 1.

Embodiment 3.

Figure 4:
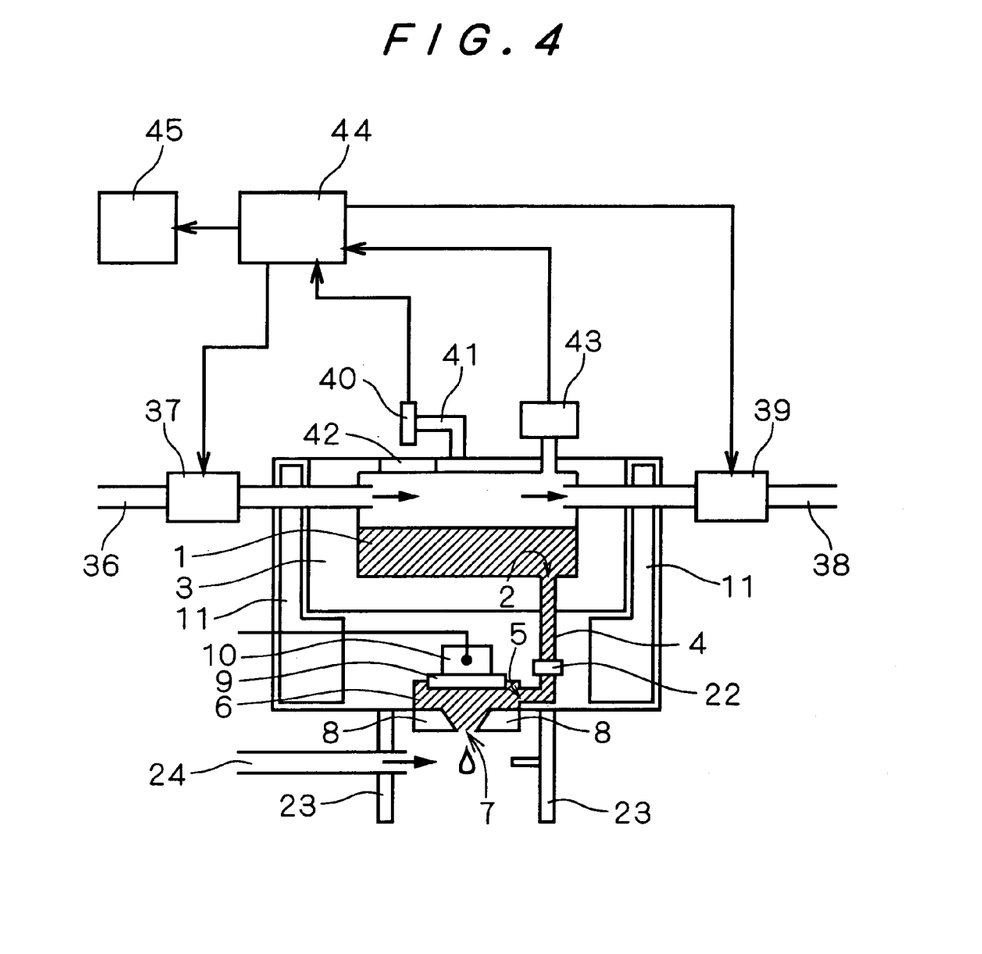
FIG. 4 is a sectional view typically showing the structure of a bump forming apparatus according to an embodiment 3 of the present invention.

FIG. 4 is a sectional view typically showing the structure of a bump forming apparatus according to an embodiment 3 of the present invention. As shown in FIG. 4, the bump forming apparatus according to the embodiment 3 is based on the bump forming apparatus according to the embodiment 2 shown in FIG. 3, and further comprises an error display part 45 connected with a gas pressure control part 44.

When determining that the surface level of fused solder 1 in a first tank 3, detected by a surface level sensor 40, falls below a previously set prescribed value, the gas pressure control part 44 makes an arbitrary display indicating solder shortage on the error display part 45.

According to the bump forming apparatus of the embodiment 3, as hereinabove described, solder shortage is displayed on the error display part 45 when the surface level of the fused solder 1 falls below the previously set prescribed value, whereby the operator can recognize solder shortage in the first tank 3 in early stages.

Embodiment 4.

In the bump forming apparatus and the bump forming method according to the embodiment 2, solid solder is introduced into the first tank 3 and thereafter heated/fused with the first heater 11, so that the fused solder 1 is stored in the first tank 3. If the solid solder contains a bubble at this time, the bubble may be mixed into the fused solder 1, to result in dispersion of the amount of the fused solder 1 discharged from the first opening 7 and the discharge position. In some cases, the above dispersion results from a bubble remaining on the contact surface between the cavity 6 and the diaphragm 9. An embodiment 4 of the present invention proposes a bump forming apparatus and a bump forming method which can implement stabilization of a discharged amount of and a discharge position for fused solder 1 by previously removing such a bubble.

Figure 5:
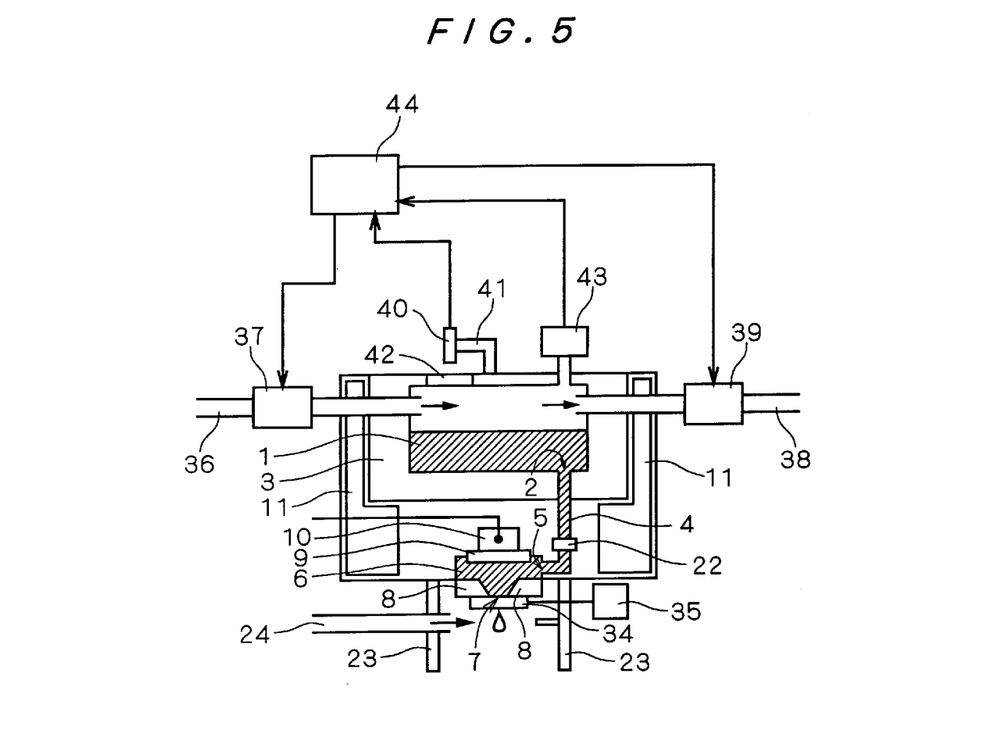
FIG. 5 is a sectional view typically showing the structure of a bump forming apparatus according to an embodiment 4 of the present invention.

FIG. 5 is a sectional view typically showing the structure of the bump forming apparatus according to the embodiment 4 of the present invention. As shown in FIG. 5, the bump forming apparatus according to the embodiment 4 is based on the bump forming apparatus according to the embodiment 2 shown in FIG. 3, and further comprises a detachable nozzle lid 34 blocking a first opening 7 from below and a nozzle lid driving part 35 for driving the nozzle lid 34. The remaining structure of the bump forming apparatus according to the embodiment 4 is similar to that of the bump forming apparatus according to the embodiment 2 shown in FIG. 3.

A bump forming method employing the bump forming apparatus shown in FIG. 5 is now described. First, solid solder is introduced into a first tank 3. The nozzle lid driving part 35 drives the nozzle lid 34, to block the first opening 7 with the nozzle lid 34 from below.

Then, a first valve 37 is closed and a second valve 39 is opened, thereby discharging air from the first tank 3 through an inert gas discharge pipe 38 and evacuating the first tank 3, a pipe 4 and a cavity 6. In this state, a first heater 11 heats/fuses the solid solder, thereby storing the fused solder 1 in the first tank 3.

After a bubble mixed into the fused solder 1 is sufficiently removed (about 15 minutes later), the first valve 37 is opened to introduce inert gas into the first tank 3 from an inert gas introduction pipe 36, thereby returning the first tank 3 to the atmospheric pressure. Then, the nozzle lid driving part 35 drives the nozzle lid 34, to remove the nozzle lid 34 from the first opening 7. Thereafter a surface level sensor 40 detects a surface level h1 of the fused solder 1, as described above with reference to the embodiment 2.

According to the bump forming apparatus and the bump forming method of the embodiment 4, as hereinabove described, a bubble mixed into the fused solder 1 can be previously removed, whereby the amount of the fused solder 1 discharged from the first opening 7 and the discharge position can be prevented from dispersion resulting from such a bubble.

Embodiment 5.

Figure 6:
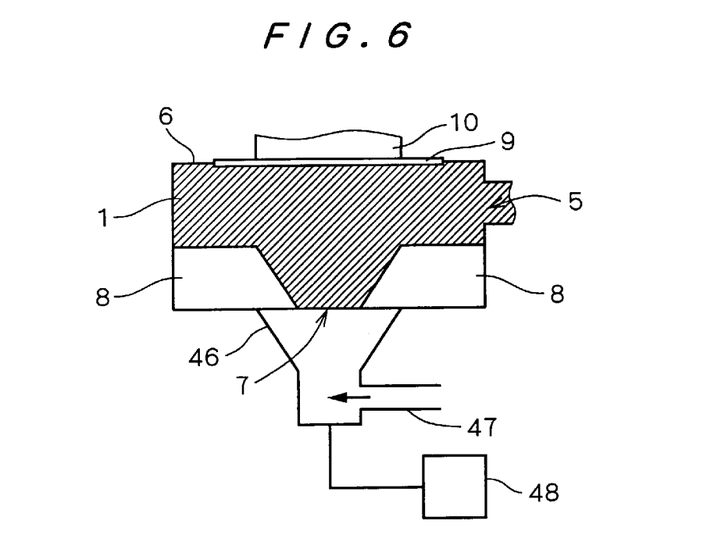
FIG. 6 is a sectional view showing the structure of a bump forming apparatus according to an embodiment 5 of the present invention in a partially enlarged manner.

FIG. 6 is a sectional view showing the structure of a bump forming apparatus according to an embodiment 5 of the present invention in a partially enlarged manner. As shown in FIG. 6, the bump forming apparatus according to the embodiment 5 comprises a detachable nozzle cap 46 blocking a first opening 7, an inert gas introduction pipe 47 for introducing inert gas into the nozzle cap 46, and a nozzle cap driving part 48 for driving the nozzle cap 46.

When the apparatus is stopped to wait for carriage of a chip 26, for example, the nozzle cap driving part 48 drives the nozzle cap 46, thereby blocking the first opening 7 with the nozzle cap 46 from below. Then, inert gas is introduced into the nozzle cap 46 from the inert gas introduction pipe 47.

According to the bump forming apparatus and a bump forming method of the embodiment 5, as hereinabove described, fused solder 1 in a cavity 6 can be prevented from oxidation through the first opening 7 when the operation of the apparatus is suspended.

Embodiment 6.

Figure 7:
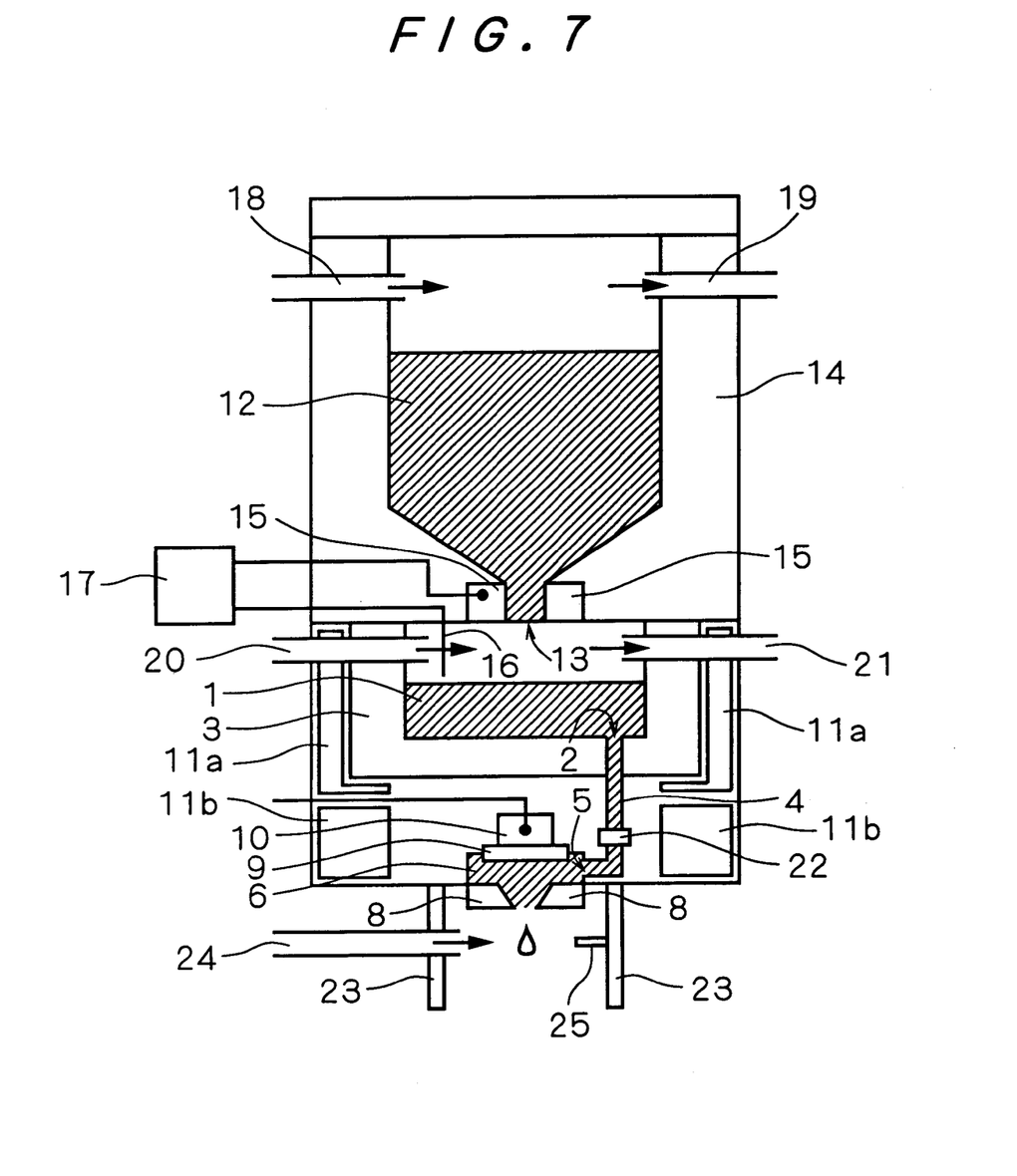
FIG. 7 is a sectional view typically showing the structure of a bump forming apparatus according to an embodiment 6 of the present invention.

FIG. 7 is a sectional view typically showing the structure of a bump forming apparatus according to an embodiment 6 of the present invention. As shown in FIG. 7, a first heater 11 individually includes a third heater 11a for heating a first tank 3 and a fourth heater 11b for heating a cavity 6 in the bump forming apparatus according to the embodiment 6.

The third heater 11a increases the temperature of fused solder 1 stored in the first tank 3 to a level close to the solder fusing temperature, while the fourth heater 11b increases the temperature of fused solder 1 stored in the cavity 6 to a level higher than the solder fusing temperature.

According to the bump forming apparatus and a bump forming method of the embodiment 6, as hereinabove described, the temperature of the fused solder 1 in the cavity 6 is increased to a high level. Thus, the viscosity of the fused solder 1 is reduced around a nozzle 8, whereby the fused solder 1 can be discharged from the first opening 7 in a stable amount even if having high viscosity. Further, the temperature of the fused solder 1 in the first tank 3 is increased to a level around the solder fusing temperature, not to facilitate oxidation of the fused solder 1 in the first tank 3.

Embodiment 7.

Figure 8:
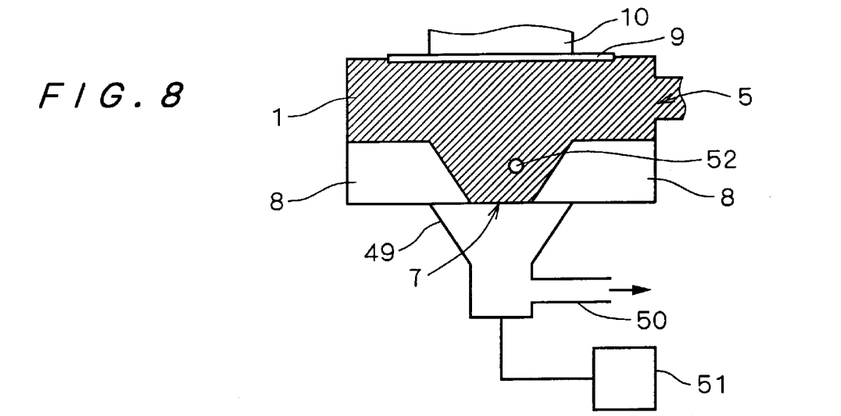
FIG. 8 is a sectional view showing the structure of a bump forming apparatus according to an embodiment 7 of the present invention in a partially enlarged manner.

FIG. 8 is a sectional view showing the structure of a bump forming apparatus according to an embodiment 7 of the present invention in a partially enlarged manner. As shown in FIG. 8, the bump forming apparatus according to the embodiment 7 comprises a suction pad 49 attachable/detachable to/from a first opening 7 for sucking fused solder 1 from the first opening 7, a discharge pipe 50 for discharging the sucked fused solder 1 from the apparatus, and a suction pad driving part 51 for driving the suction pad 49.

When a bubble 52 is mixed into the fused solder 1 in a nozzle 8 to unstabilize discharge of the fused solder 1 from the first opening 7 as shown in FIG. 8 or the fused solder 1 in the nozzle 8 is oxidized through the first opening 7 due to stoppage of the apparatus over a long time, the suction pad driving part 51 drives the suction pad 49 to press the suction pad 49 against the first opening 7. The fused solder 1 is sucked from the nozzle 8 and discharged from the apparatus through the discharge pipe 50.

According to the bump forming apparatus and a bump forming method of the embodiment 7, as hereinabove described, the fused solder 1 mixed with the bubble 52 or oxidized through the first opening 7 can be sucked/removed by the suction pad 49. Thus, the fused solder 1 can be stably discharged from the first opening 7.

Embodiment 8.

Figure 9:
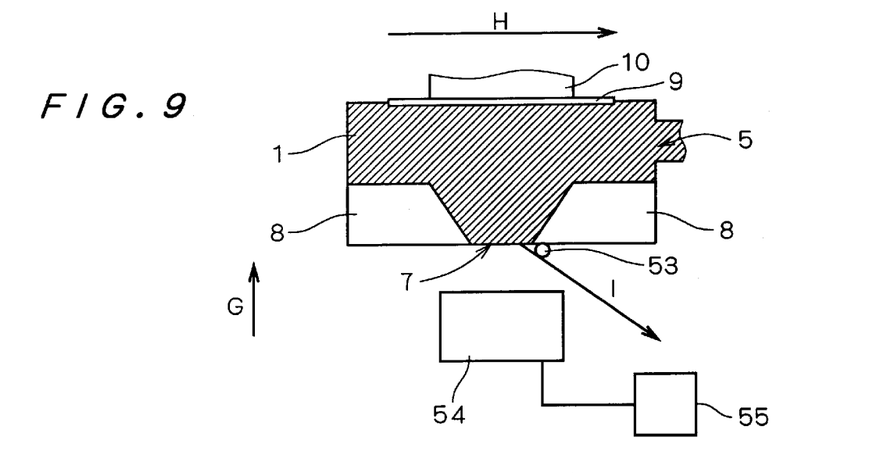
FIG. 9 is a sectional view showing the structure of a bump forming apparatus according to an embodiment 8 of the present invention in a partially enlarged manner.

FIG. 9 is a sectional view showing the structure of a bump forming apparatus according to an embodiment 8 of the present invention in a partially enlarged manner. As shown in FIG. 9, the bump forming apparatus according to the embodiment 8 comprises a solder residue removing tool 54 attachable/detachable to/from a first opening 7 for removing solder residue 53 around the first opening 7 and a driving part 55 for driving the solder residue removing tool 54. The solder residue removing tool 54 can be made of heat-resistant rubber, for example.

When fused solder 1 is discharged from the first opening 7 while the solder residue 53 adheres to a surface of a nozzle 8 as shown in FIG. 9, the discharge direction for the fused solder 1 is bent along arrow I due to influence by the solder residue 53. Consequently, precision of the discharge position for the fused solder 1 is reduced on a chip 26.

The driving part 55 drives the solder residue removing tool 54 along arrow G and presses the same against the nozzle 8, and thereafter drives the solder residue removing tool 54 along arrow H in this state, thereby sweeping off/removing the solder residue 53.

The solder residue 53 is removed by the solder residue removing tool 54 when the precision of the discharge position for the fused solder 1 is reduced or when restarting operations after stoppage of the apparatus. Alternatively, the solder residue 53 may be periodically removed during continuous driving of the apparatus.

According to the bump forming apparatus and a bump forming method of the embodiment 8, as hereinabove described, the solder residue 53 adhering to the surface of the nozzle 8 can be removed, whereby the discharge position for the fused solder 1 can be stabilized.

Embodiment 9.

Figure 10:
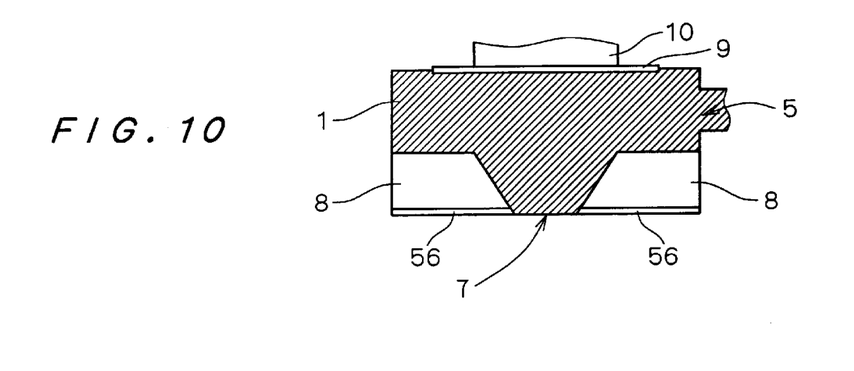
FIG. 10 is a sectional view showing the structure of a bump forming apparatus according to an embodiment 9 of the present invention in a partially enlarged manner.

FIG. 10 is a sectional view showing the structure of a bump forming apparatus according to an embodiment 9 of the present invention in a partially enlarged manner. As shown in FIG. 10, a surface of a nozzle 8 is coated with a coating material 56 in the bump forming apparatus according to the embodiment 9. The coating material 56 is prepared from a material repelling solder, such as polytetrafluoroethylene (PTFE), fluorinated ethylene propylene (FEP), parafluoroalkoxy fluororesin (PFA), ceramic, titanium or the like.

According to the bump forming apparatus of the embodiment 9, as hereinabove described, the surface of the nozzle 8 is coated with the material repelling solder. Thus, solder residue hardly adheres to the surface of the nozzle 8, whereby a discharge position for fused solder 1 can be stabilized.

Embodiment 10.

In the bump forming apparatus according to each of the aforementioned embodiments, the surface coming into contact with the fused solder 1 such as the inner surface of the first tank 3, the pipe 4 or the cavity 6, for example, is coated with a material having good solder wettability. The surface is coated by plating or evaporating a material such as solder, nickel or gold.

According to a bump forming apparatus of an embodiment 10 of the present invention, the surface coming into contact with the fused solder 1 is coated with a material having good solder wettability, whereby a bubble is hardly formed in the fused solder 1 and hence the fused solder 1 can be stably discharged.

Embodiment 11.

Figure 11:
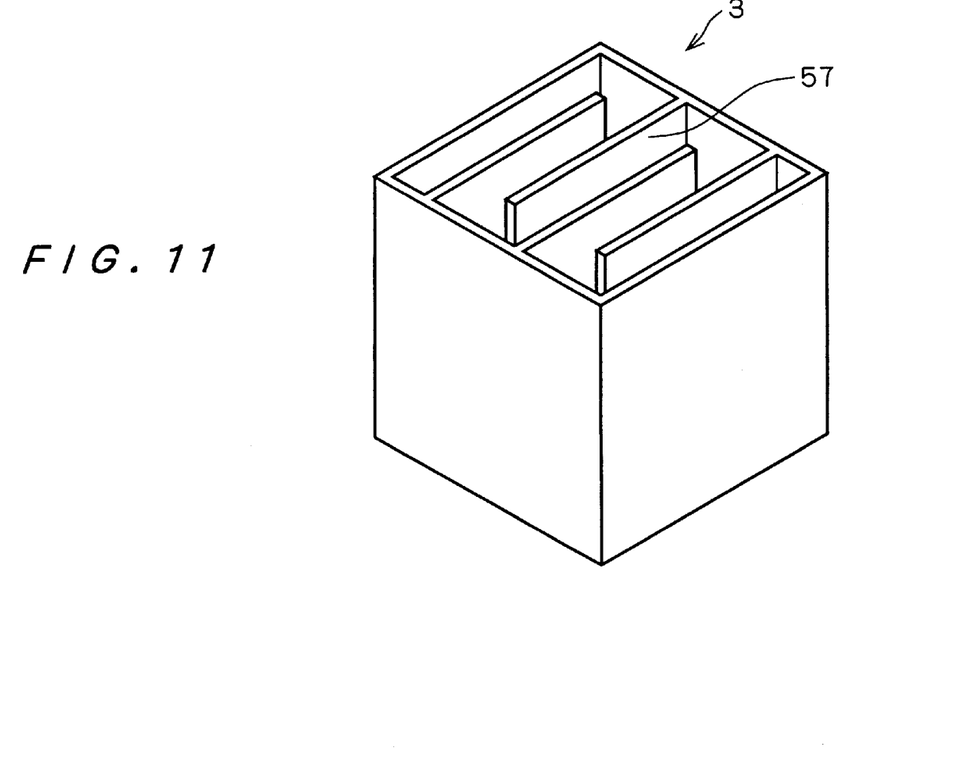
FIG. 11 is a perspective view showing the structure of a first tank in a bump forming apparatus according to an embodiment 11 of the present invention.
Figure 12:
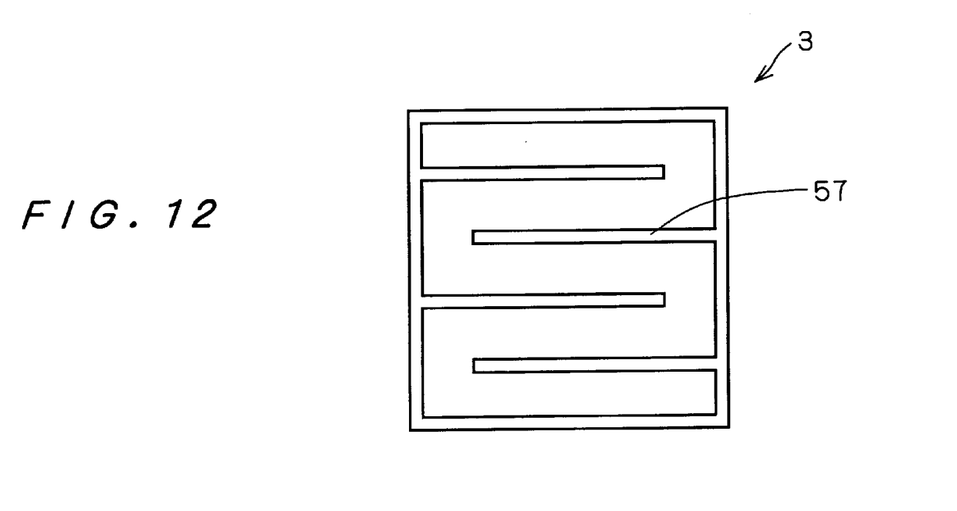
FIG. 12 is a top plan view showing the structure of the first tank in the bump forming apparatus according to the embodiment 11 of the present invention.

FIGS. 11 and 12 are a perspective view and a top plan view showing the structure of a first tank 3 in a bump forming apparatus according to an embodiment 11 of the present invention. As shown in FIGS. 11 and 12, a lattice structure 57 is provided in the first tank 3.

A chip 26 is provided with a plurality of electrodes to be formed with bumps in practice. In order to form bumps 29 on all electrodes, the bump forming apparatus must be sequentially moved by an XY table (not shown) or the like. If fused solder 1 vertically swings in the first tank 3 at this time, the static pressure of the fused solder 1 applied to a nozzle 8 changes to unstabilize discharge of the fused solder 1 from a first opening 7 as a result.

According to the bump forming apparatus of the embodiment 11, however, the lattice structure 57 is provided in the first tank 3, whereby swinging of the fused solder 1 in the first tank 3 can be suppressed to stabilize discharge.

Embodiment 12.

An embodiment 12 of the present invention proposes a bump forming method capable of stably ensuring an amount of fused solder 1 discharged from a first opening 7 even if the fused solder 1 has high viscosity.

Figure 13:
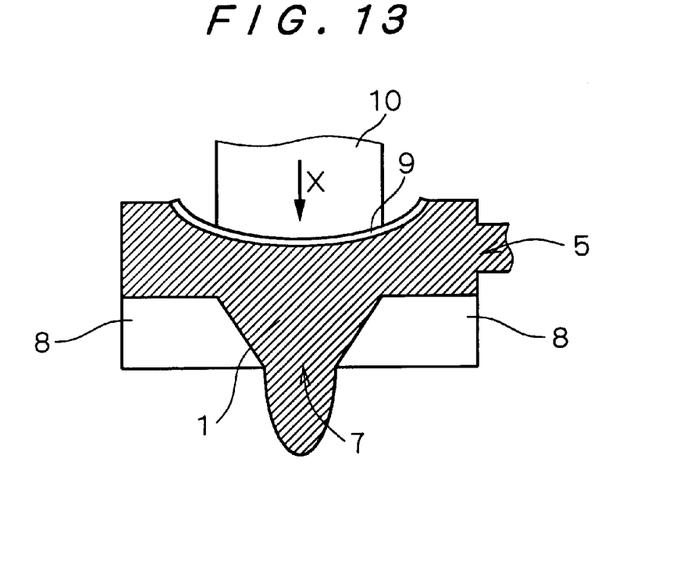
FIGS. 13 and 14 are model diagrams for illustrating a bump forming method according to an embodiment 12 of the present invention.
Figure 14:
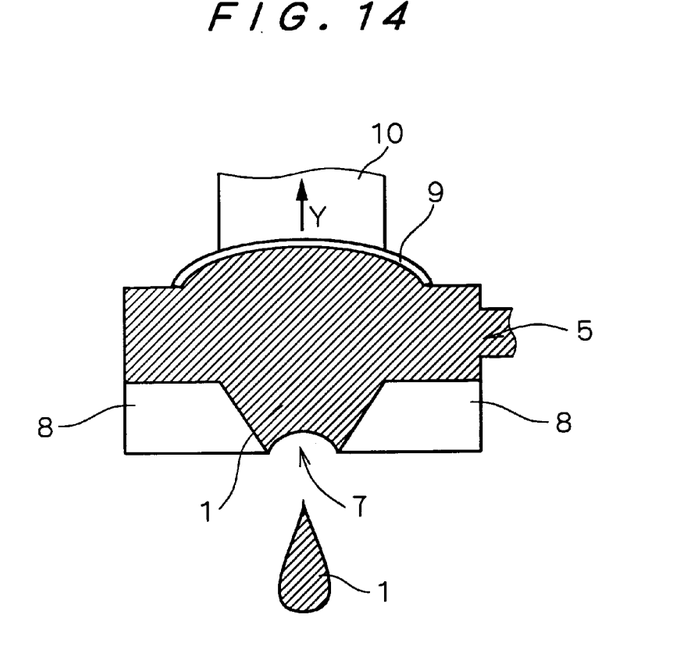

FIGS. 13 and 14 are model diagrams for illustrating the bump forming method according to the embodiment 12 of the present invention. FIG. 2 shows a state of a piezoelectric element 10 to which no voltage is externally applied. The piezoelectric element 10 is expanded by application of positive voltage, for example, to press down a diaphragm 9 along arrow X. Thus, the diaphragm 9 applies pressure to the fused solder 1, which in turn enters a state immediately before being dropped from the first opening 7 (FIG. 13).

Then, negative voltage, for example, is externally applied to the piezoelectric element 10 for contracting the piezoelectric element 10 and pulling up the diaphragm 9 along arrow Y. Thus, the fused solder 1 breaks away well around the first opening 7, to be dropped from the first opening 7.

According to the bump forming method of the embodiment 12, as hereinabove described, the diaphragm 9 is temporarily pushed down along arrow X and then pulled up along arrow Y. Thus, the fused solder 1 breaks away well around the first opening 7 even if having high viscosity, whereby the amount of the fused solder 1 discharged from the first opening 7 can be stably ensured.

Embodiment 13.

If a bump forming apparatus is stopped for a long time, fused solder 1 may be remarkably oxidized through a first opening 7 to destabilize the first discharge of the fused solder 1 after the apparatus restarts its operations. Therefore, dummy discharge is performed once (or a plurality of times as needed) after the apparatus restarts its operations, to thereafter start discharge toward a chip 26. Dummy discharge is not restricted to the above case but similar dummy discharge may be performed when the fused solder 1 is remarkably oxidized through the first opening 7.

According to a bump forming method of an embodiment 13 of the present invention, as hereinabove described, dummy discharge is performed after the apparatus restarts its operations, whereby discharge toward a chip 26 can be stabilized.

While the invention has been shown and described in detail, the foregoing description is in all aspects illustrative and not restrictive. It is therefore understood that numerous modifications and variations can be devised without departing from the scope of the invention.

What is claimed is:

1. A bump forming apparatus, comprising:

a first tank storing fused solder and having an outlet for said fused solder;

a pipe having one end connected with said outlet;

a cavity, arranged below said first tank, having an inlet for said fused solder connected with another end of said pipe;

a nozzle, arranged on a lower portion of said cavity, having a first opening on its bottom surface;

a pressure element properly pressurizing said fused solder in said cavity toward said first opening for dropping said fused solder from said first opening;

a first heater heating said first tank and said cavity; and a static pressure control part for keeping static pressure of said fused solder applied to said nozzle at a constant value.

2. The bump forming apparatus according to claim 1, wherein said pressure element includes:

a diaphragm arranged on an upper portion of said cavity, and a piezoelectric element fixed to an upper surface of said diaphragm, and said diaphragm is capable of pressurizing said fused solder in said cavity toward said first opening and oppositely to said first opening.

3. The bump forming apparatus according to claim 1, wherein said static pressure control part includes:

a second tank, storing solid solder and having a second opening on its bottom surface, arranged above said first tank, a second heater provided around said second opening, a level detector detecting a surface level of said fused solder in said first tank, and a control part controlling driving of said second heater on the basis of a detection signal from said level detector.

4. The bump forming apparatus according to claim 3, further comprising:

a first inert gas introduction part introducing inert gas into said second tank, a first inert gas discharge part discharging said inert gas introduced from said first inert gas introduction part from said second tank, a second inert gas introduction part introducing inert gas into said first tank, and a second inert gas discharge part discharging said inert gas introduced from said second inert gas introduction part from said first tank.

5. The bump forming apparatus according to claim 1, wherein said static pressure control part includes:

an inert gas introduction part introducing inert gas into said first tank, a first gas flow rate control part controlling the amount of said inert gas flowing into said first tank from said inert gas introduction part, a gas discharge part discharging gas from said first tank, a second gas flow rate control part controlling the amount of said gas flowing out from said first tank through said gas discharge part, a level detector detecting a surface level of said fused solder in said first tank, and a gas pressure control part controlling driving of at least one of said first and second gas flow rate control parts on the basis of a detection signal from said level detector.

6. The bump forming apparatus according to claim 5, further comprising a solder shortage display part displaying solder shortage when said surface level of said fused solder in said first tank falls below a previously set level.

7. The bump forming apparatus according to claim 5, further comprising:

a detachable nozzle lid blocking said first opening, and a driving part driving said nozzle lid.

8. The bump forming apparatus according to claim 1, further comprising a filter provided in said pipe for removing an impurity contained in said fused solder.

9. The bump forming apparatus according to claim 1, further comprising:

a cover, provided around said first opening, having an open bottom surface, and an inert gas inlet introducing inert gas into said cover.

10. The bump forming apparatus according to claim 1, further comprising a sensor detecting presence/absence of dropping of said fused solder from said first opening.

11. The bump forming apparatus according to claim 1, further comprising:

a cover, having open upper and bottom surfaces, arranged in a dropping path for said fused solder between said first opening and an object for forming a bump around a portion for forming said bump, a reducing gas inlet introducing reducing gas into said cover, and a heating tool locally heating said bump.

12. The bump forming apparatus according to claim 1, further comprising:

a detachable nozzle cap blocking said first opening, an inert gas introduction pipe introducing inert gas into said nozzle cap, and a driving part driving said nozzle cap.

13. The bump forming apparatus according to claim 1, wherein said first heater individually includes a second heater heating said first tank and a third heater heating said cavity.

14. The bump forming apparatus according to claim 1, further comprising:

a suction tool attachable/detachable to/from said first opening for sucking said fused solder from said first opening, and a driving part driving said suction tool.

15. The bump forming apparatus according to claim 1, further comprising:

a solder residue removing tool for sweeping off/removing solder residue adhering onto the bottom surface of said nozzle around said first opening.

16. The bump forming apparatus according to claim 1, wherein the bottom surface of said nozzle around said first opening is coated with a material repelling solder.

17. The bump forming apparatus according to claim 1, wherein at least inner surfaces of said first tank and said cavity are coated with a material having good solder wettability.

18. The bump forming apparatus according to claim 1, further comprising a lattice structure provided in said first tank.

19. A bump forming method, comprising the steps of:

(a) introducing solid solder into a container;

(b) evacuating said container;

(c) heating said container thereby fusing said solid solder and obtaining fused solder;

(d) releasing said container from the vacuum state after a bubble mixed into said fused solder is removed; and (e) discharging said fused solder toward an object of bump formation.

20. A bump forming method of forming a bump on an object of bump formation by discharging stored fused solder from a nozzle, comprising the steps of:

(a) dummy-discharging said fused solder from said nozzle; and (b) discharging said fused solder toward said object of bump formation after said step (a).

* * * * *